United States Patent [19]

Okase et al.

[11] Patent Number: 5,359,148
[45] Date of Patent: Oct. 25, 1994

[54] HEAT-TREATING APPARATUS

[75] Inventors: Wataru Okase; Takashi Tanahashi, both of Sagamihara; Takenobu Matsuo, Kofu, all of Japan

[73] Assignees: Tokyo Electron Kabushiki Kaisha; Tokyo Electron Tohoku Kabushiki Kaisha, Japan

[21] Appl. No.: 96,893

[22] Filed: Jul. 26, 1993

[30] Foreign Application Priority Data

Jul. 31, 1992 [JP] Japan ................. 4-223519

[51] Int. Cl.⁵ ............................... C23C 16/00
[52] U.S. Cl. ............................ 118/724; 118/715; 118/725; 118/733; 219/395; 219/400; 219/411; 285/364; 285/911
[58] Field of Search ............... 118/715, 724, 725, 733; 219/395, 400, 411; 285/364, 911

[56] References Cited

U.S. PATENT DOCUMENTS

| | | | |
|---|---|---|---|
| 4,448,448 | 5/1984 | Pollia | 285/368 |
| 4,466,641 | 8/1984 | Heilman et al. | 285/384 |
| 4,527,818 | 7/1985 | Rundell | 285/911 |

Primary Examiner—R. Bruce Breneman
Assistant Examiner—Ramamohan Rao Paladugu
Attorney, Agent, or Firm—Beveridge, DeGrandi, Weilacher & Young

[57] ABSTRACT

A heat-treating apparatus has a reaction vessel being adapted for performing a heat process for a workpiece to be treated and having a joint pipe portion and an outer pipe jointed to the joint pipe portion and of the reaction vessel. A sealing member is disposed between the outer pipe and the joint pipe portion. The sealing member has a relatively soft core member and a film harder than the core member. The film is disposed on the surface of the core member and has a heat resistance and a chemical resistance. Since the core member of the sealing portion has flexibility, it easily deforms corresponding to the shape of the sealing portion. The film provided on the core member prevents the sealing member from thermally adhering to the sealing portion and from thermally deteriorating.

16 Claims, 7 Drawing Sheets

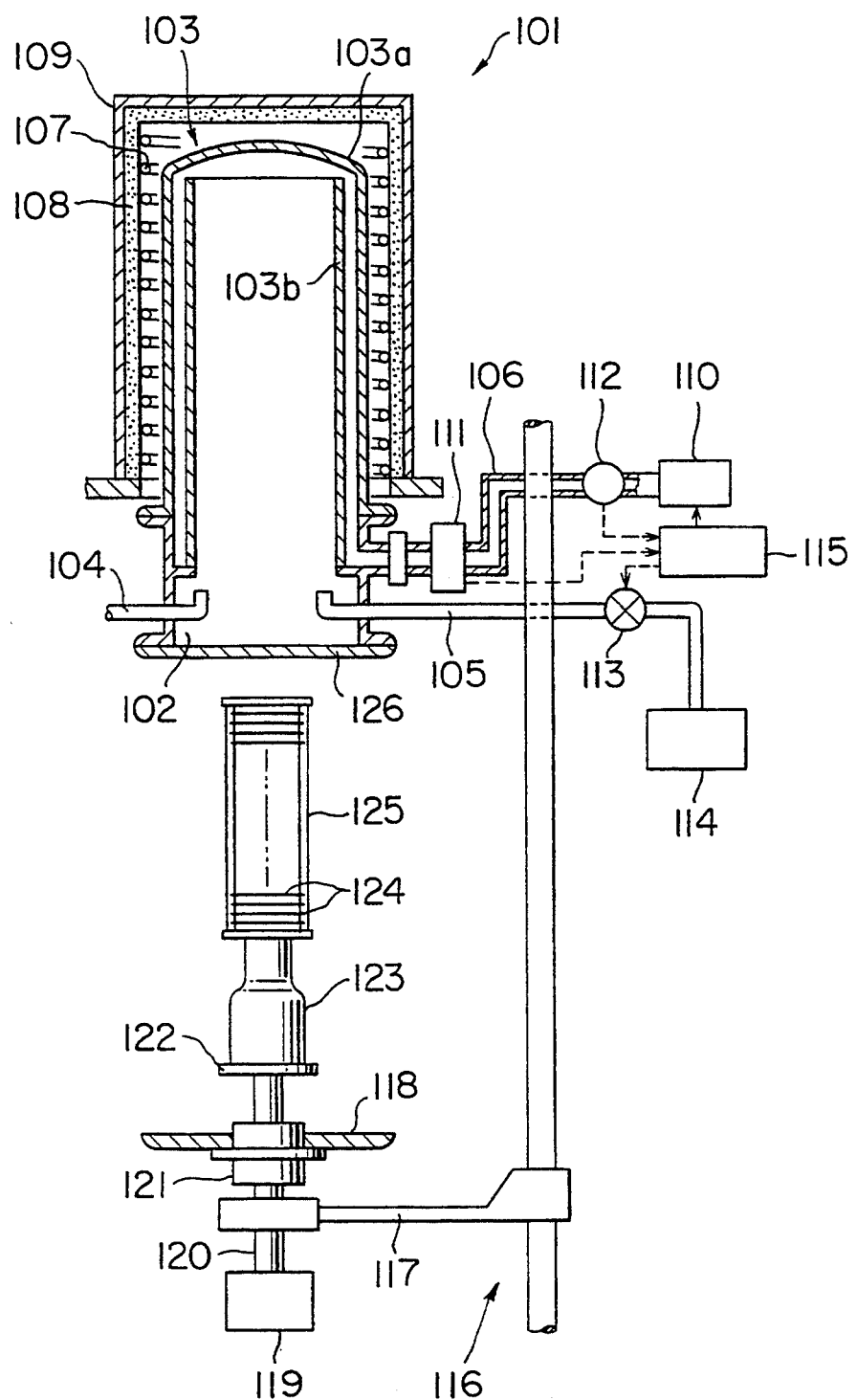
F I G. 10

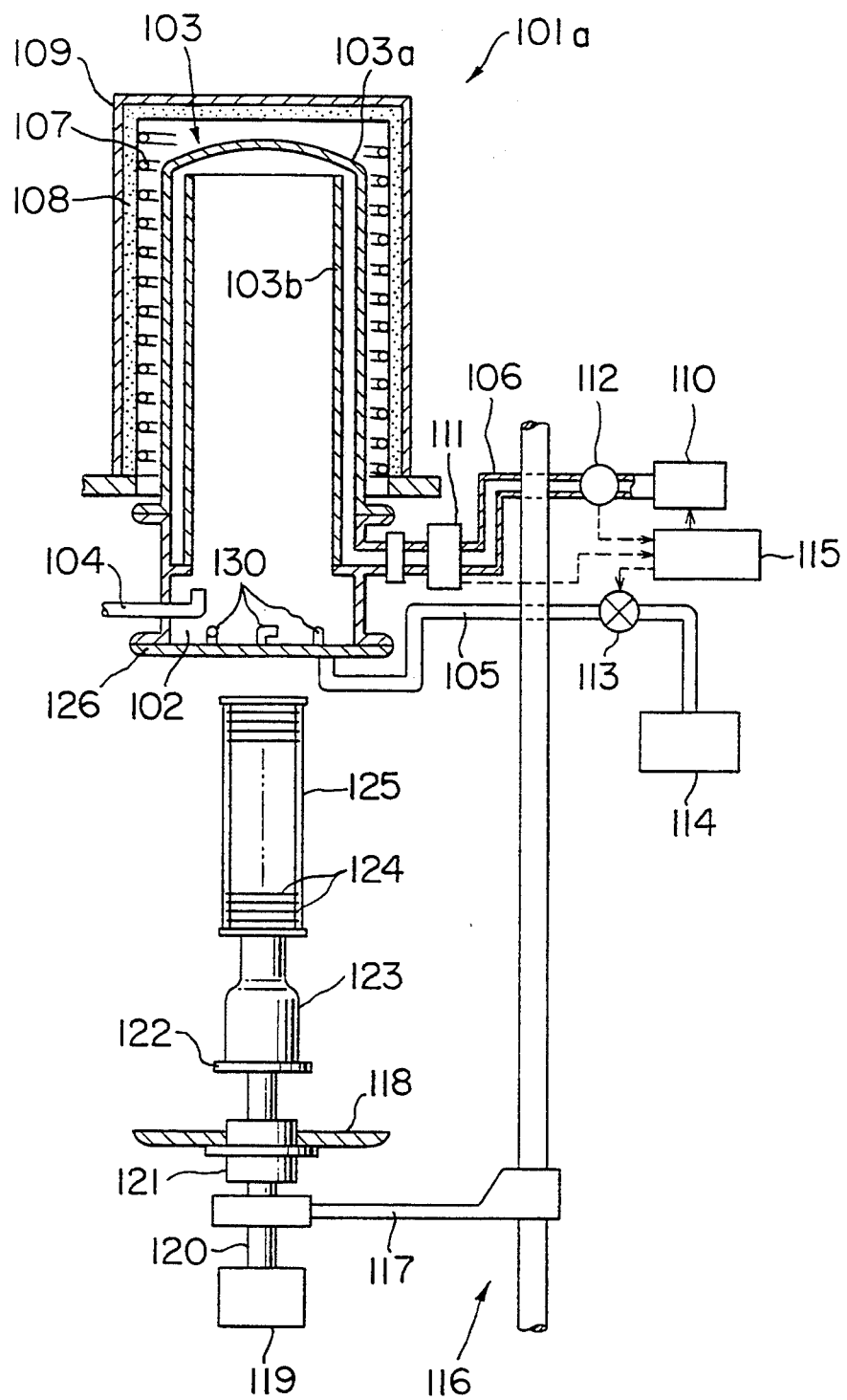
F I G. 11

HEAT-TREATING APPARATUS

BACKGROUND OF THE INVENTION

1. Field of the Invention

The present invention relates to a heat-treating apparatus for semiconductor producing equipment, in particular, to a heat-treating apparatus with high sealing characteristics.

2. Description of the Related Art

When semiconductor devices are produced, semiconductor wafers are heat-treatinged by for example oxidation-diffusion process or CVD process.

In a heat-treating apparatus used for such a heat treatment, a cylindrical heater is disposed around a cylindrical reaction vessel which is made of a heat resisting material such as quartz. Around the heater, a cylindrical heat resisting material is disposed. The reaction vessel comprises a gas supply port and a gas exhaust port which are made of quartz glass. The gas supply port is connected to a gas supply portion. The gas exhaust port is connected to a gas exhaust portion. Both the gas supply port and the gas exhaust port are made of quartz glass.

In such a heat-treating apparatus, a semiconductor wafer is disposed inside the reaction vessel in which various heat-treatinges are performed. Examples of process gases are oxygen ($O_2$), nitrogen ($N_2$), hydrogen chloride (HCl), hydrogen ($H_2$), oxychloride phosphorus ($POCl_3$), and water vapor ($H_2O$).

During the heat-treating, while a gas is being exhausted from the reaction vessel, a predetermined process gas is supplied into the reaction vessel which is decompressed to a predetermined pressure or restored to the normal pressure. After the heat-treating is completed, an inert gas such as nitrogen is supplied into the reaction vessel and thereby the process gas is exhausted therefrom.

Although joint portions where the reaction vessel is jointed to the gas supply portion and the gas exhaust portion are heated to around 200° C., however, it should be securely sealed. To securely seal the joint portions, Teflon pipes have been used and tightened. As an alternative method, with quartz pipes or the like and O rings, such joint portions have been sealed.

In the sealing construction of the conventional heat-treating apparatus, an end of a Teflon pipe is connected to a gas supply port integrally constituted on a side wall of the reaction vessel made of highly pure quartz, the other end of the Teflon pipe being connected to a Teflon hose.

However, in the sealing construction of such a heat-treating apparatus, since the Teflon pipe is exposed to high temperature atmosphere for a long time, it is hardened and deformed. Thus, a gas tends to leak from the sealing portions.

In another sealing construction of a heat-treating apparatus, an end of a quartz pipe is tightly connected to a gas supply port integrally constituted on a side wall of a reaction vessel made of highly pure quartz. Examples of O rings are made of fluororubber which can withstand high temperatures of around 200° C. which are merchandized as trade marks of "BAITON", "CALLETS", and so forth.

However, with the sealing construction having such O rings, the elasticity of the O rings will be likely lost due to aged tolerance, thereby deteriorating the sealing characteristics. In addition, the conventional O rings tend to strongly adhere to quartz pipes by heat. Moreover, if a gas leaks from an O ring, it will solidify and adhere to a sealing portion. Thus, it will become difficult to remove the quartz pipe from the gas supply port. When an excessive force is applied to the quartz pipe in order to remove it from the gas supply port, they will be damaged. Furthermore, when the O ring is heated to a high temperature, an impure gas takes place and mixes with the process gas, thereby lowering the yield of semiconductor wafers.

SUMMARY OF THE INVENTION

An object of the present invention is to provide a heat-treating apparatus with high sealing characteristics maintained stably for a long time and with joint portions which have high rigidity against replacement.

An aspect of the present invention is a heat-treating apparatus, comprising a reaction vessel being adapted for performing a heat-treating for a workpiece to be treated and having a joint pipe portion, an outer pipe jointed to the joint pipe portion of the reaction vessel, and a sealing member disposed between the outer pipe and the joint pipe portion and adapted for tightly closing a passage defined inside the outer pipe and the joint pipe portion, wherein the sealing member having a core member and a film, the core member being relatively soft, the film being disposed on the surface of the core member and being harder than the core member, the film having heat resistance and chemical resistance.

According to the present invention, since a hard film with heat resistance and chemical resistance is disposed on the surface of a soft core member, it provides with flexibility against the shape of the sealing portions. In addition, the film formed on the surface of the core member prevents the sealing portions from being solidified with process gas and from being thermally deteriorated.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 10 is a sectional view showing the upright type CVD equipment of FIG. 9;

FIG. 11 is a sectional view showing the construction of a heat-treating apparatus according to another example of the present invention.

DESCRIPTION OF PREFERRED EMBODIMENTS

Next, embodiments of the present invention will be described.

First Embodiment

Figure 1:
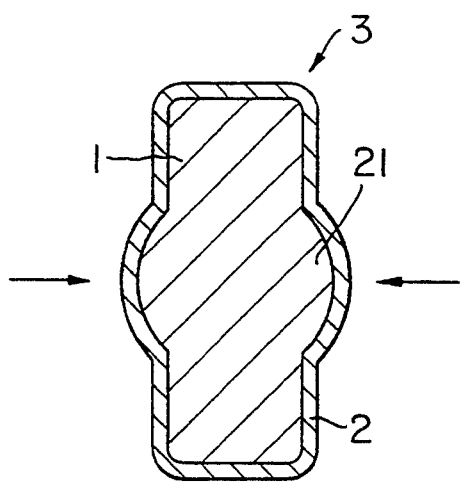
FIG. 1 is a sectional view showing a sealing member for use in a heat-treating apparatus according to a first embodiment of the present invention.

FIG. 1 is a sectional view showing a sealing member for use in a heat-treating apparatus according to a first embodiment of the present invention. In the figure, reference numeral 3 is a sealing member. The sealing member 3 comprises a core member 1 and a film 2. The core member 1 is made of a soft material. The film 2 is formed around the entire surface of the core member 1. The film is made of a material harder than the core member 1 and has a heat resistance and a chemical resistance.

As the core member 1, a material which is satisfactorily contracted corresponding to the shape of a sealing portion of a heat-treating apparatus being nipped and which stably provides with elasticity are selected. The Shore hardness (HS) of the core member 1 is preferably around 32. The compression permanent ditortion ratio of the core member 1 is preferably 65% or less at high temperatures (around 100° C.). The compression permanent ditortion ratio is a ditortion ratio where a predetermined load is applied for a predetermined period of time and then removed. An example of the material of the core member 1 is preferably ethylene tetrafluoride.

As the film 2, a hard material which has a heat resistance and a chemical resistance is used. From a standpoint of fitness to the core member 1, the material of the film 2 is preferably similar to that of the core member 1. The heat resisting temperature of the film 2 is preferably higher than that of the conventional O ring by 50° C. (namely, for example, in the range from 150° to 250° C.). In addition, the chemical resistance of the film 2 is satisfactorily stable against process gases used in semiconductor producing equipment. Preferable examples of the material of the film 2 are ethylene tetrafluoride rubber, polyamide, and the like.

When ethylene tetrafluoride resin and ethylene tetrafluoride rubber are used as the core member 1 and the film 2, respectively, they do not thermally adhere to each other. Thus, when these materials are used for the sealing portions of the thermal treatment apparatus and nipped, the film 2 will be unlikely cracked.

The thickness of the film 2 is for example in the range from 100 to 200 μm.

Figure 2:
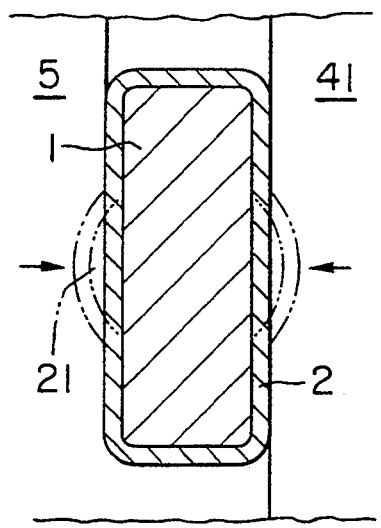
FIG. 2 is a sectional view of the sealing member of FIG. 1 which is nipped and contacted.

The core member 1 of the sealing member 3 is hollow. The sectional shape of the core member 1 may be square. As shown in FIG. 1, however, the core member 1 has preferably projecting portions 21 at side portions thereof abutting against a gas supply pipe 5 and a gas supply portion 41. As shown in FIG. 2, the projecting portions 21 at the sealing portion of the heat-treating apparatus absorb nipped force of the gas supply pipe 5 and the gas supply portion 41 and accordingly contract. Thus, the projecting portions 21 tend to follow the shape of the sealing portion, thereby improving the sealing characteristics. According to the above-described construction of the sealing member 3, since the soft core member 1 has flexibility, it easily follows the shape of the sealing portion. In addition, the film 2 prevents the sealing member from thermally adhering to the sealing portion and from deforming and heat deteriorating against process gas. Moreover, since the film 2 coats the soft core member 1, it prevents the core member 1 from giving off an impure gas.

Furthermore, since the core member 1 has the projecting portions 21 at the side portions abutting against the gas supply pipe 5 and the gas supply portion 41, the projecting portions 21 easily absorb nipping force of the sealing portion, thereby preventing the hard film 2 from breaking.

Figure 3:
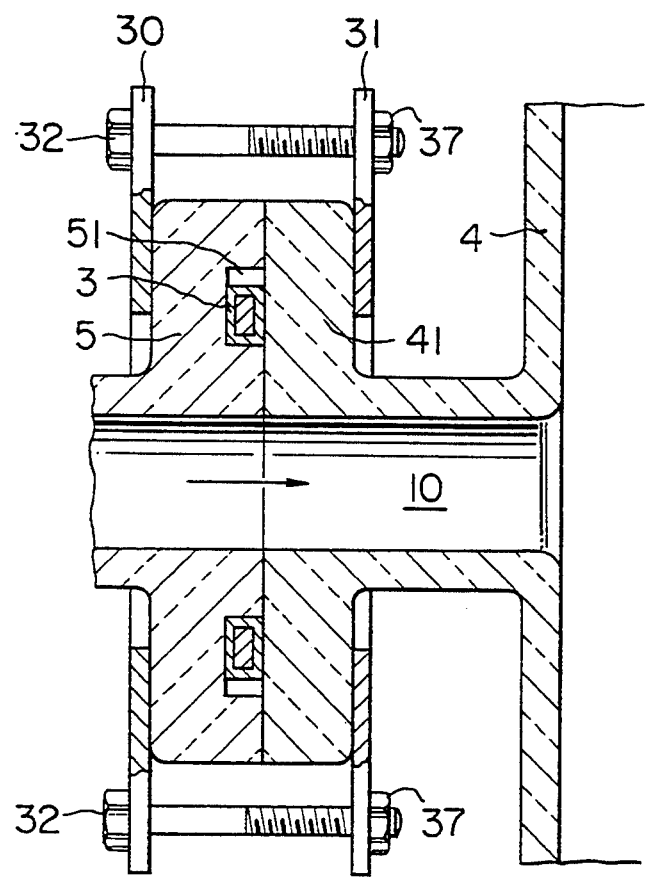
FIG. 3 is a sectional view showing the heat-treating apparatus according to the first embodiment of the present invention.

FIG. 3 is a sectional view showing the sealing member 3 which is disposed in the sealing portion of the gas supply portion of the reaction vessel of the heat-treating apparatus for semiconductor wafers.

Reference numeral 4 depicts a reaction vessel made of for example highly pure quartz. Reference numeral 41 depicts a gas supply portion (joint portion) integrally constituted on the reaction vessel 4. Reference numeral 5 depicts a gas supply pipe (outer pipe). The gas supply pipe 5 is made of for example quartz. The sealing member 3 seals a passway 10 formed inside the gas supply pipe 5.

The sealing portion of the gas supply pipe 5 has a ring-shaped groove 51. The groove 51 accommodates the sealing member 3. Thus, the sealing member 3 is accommodated in the entire ring-shaped groove 51. The gas supply portion 41 and the gas supply pipe 5 are held by a pair of ring-shaped holding plates 30 and 31. The pair of ring-shaped holding plates 30 and 31 are tightened by a bolt 32 and a nut 37.

When the sealing member 3 is nipped by the sealing surface of the gas supply portion 41 and the groove 51 of the gas supply pipe 5, the projecting portions 21 of the core member 1 absorb the nipping pressure applied to the sealing member 3 and correspondingly deform. Thus, the sealing member 3 satisfactorily seals the connecting portion. In addition, even if a process gas in the passage 10 enters the groove 51, since the film 2 on the surface of the sealing member 3 has a chemical resistance, the sealing member 3 never deteriorates. Moreover, when the sealing portion is heated to a high temperature in the range from 150° to 250° C., since the film 2 on the surface of the sealing member 3 has a heat resistance, the sealing member 3 never thermally adheres to the sealing surfaces of the groove 51 and the gas supply portion 41. Furthermore, the sealing member 3 leaks nothing. Thus, when the gas supply portion 41 and the gas supply pipe 5 are washed, the gas supply pipe 5 can be easily removed. Thus, when the gas supply portion 41 and the gas supply pipe 5 are removed, they are prevented from being damaged. In addition, even if the sealing member 3 becomes hot and thereby the soft core member 1 expels impure gas, the film 2 prevents the gas from leaking out, and therefore an impure gas does not mix with the process gas.

Figure 8:
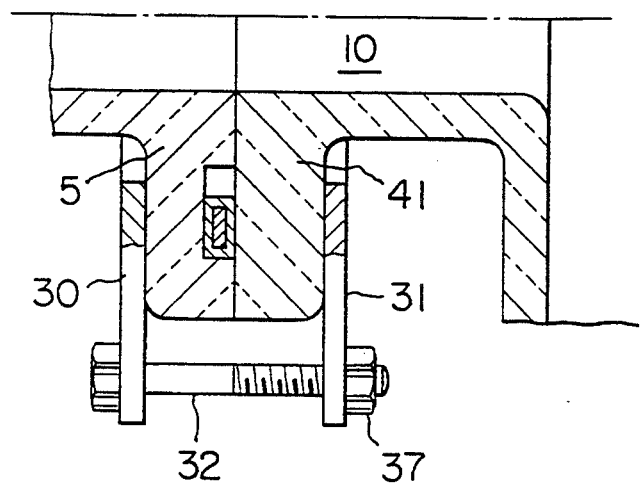
FIG. 8 is a sectional view showing the sealing member of FIG. 3, the sealing member being disposed at a different position therefrom.
Figure 9:
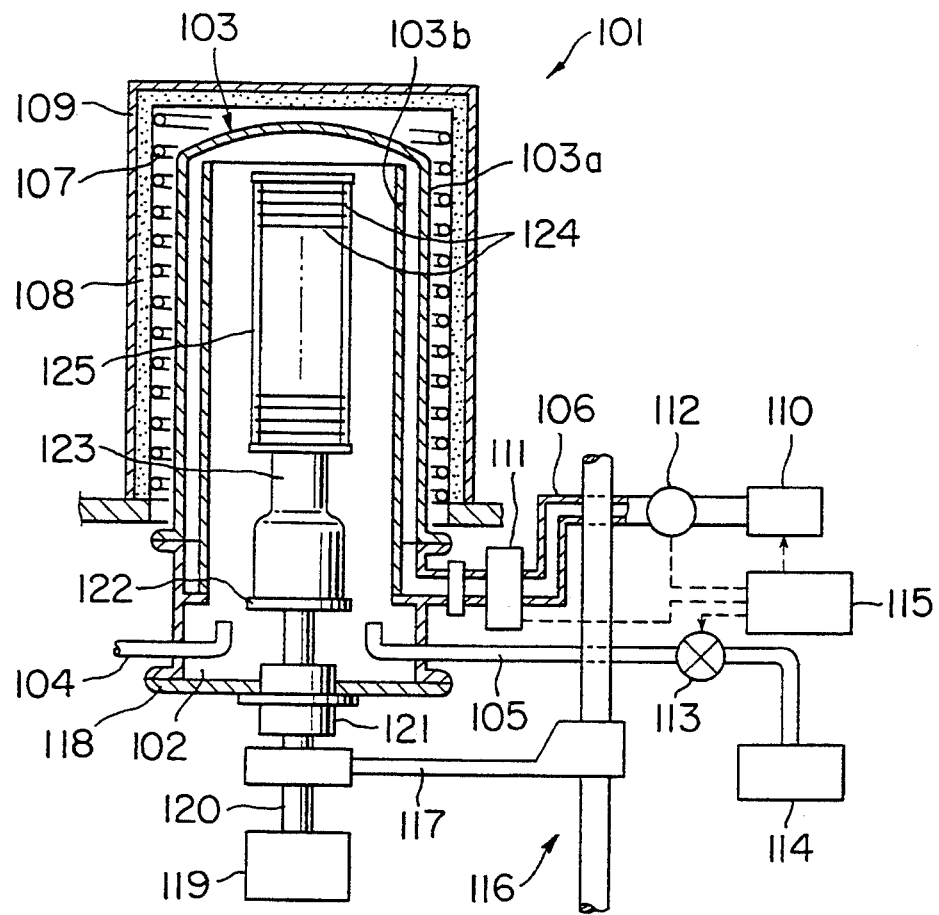
FIG. 9 is a sectional view showing the construction of upright type CVD equipment which is a heat-treating apparatus according to a fourth embodiment of the present invention.
Figure 12:
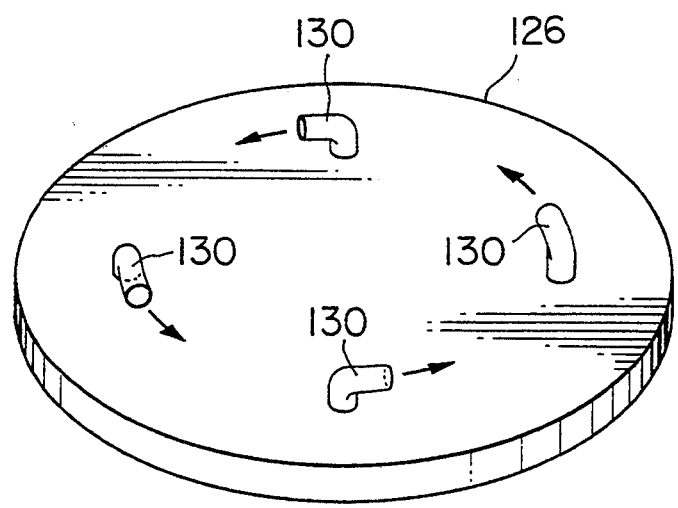
FIG. 12 is a perspective view showing the construction of principal portions of the upright type CVD equipment of FIG. 11.

In FIG. 3, the sealing member 3 was disposed in the inner radial direction of the groove 51 (on the side of the passage 10). However, it should be noted that the sealing member 51 may be disposed in the outer radial direction of the groove 51 as shown in FIG. 8.

Figure 4:
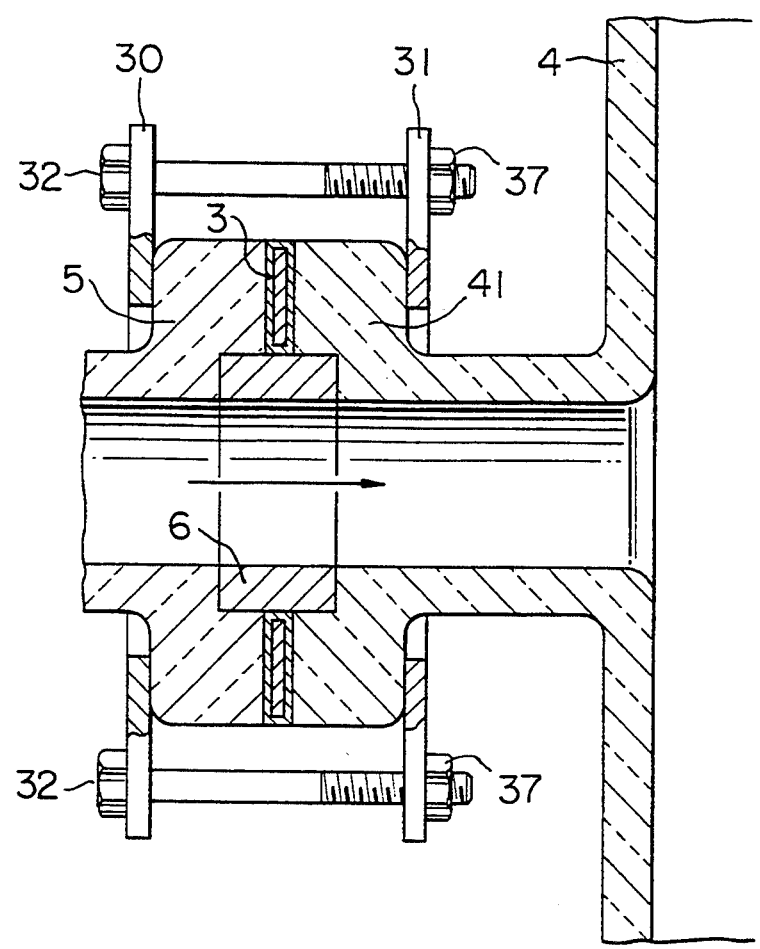
FIG. 4 is a sectional view showing a heat-treating apparatus according another example of the present invention.

FIG. 4 is a sectional view showing a seal construction where a gas supply pipe 5 does not have a groove. In FIG. 4, reference numeral 3 depicts a sealing member. The sealing member 3 is disposed between the sealing surface of a gas supply portion 41 and the sealing surface of a gas supply pipe 5. A ring-shaped alignment member 6 is disposed on the inner wall of a joint portion. The ring-shaped alignment member 6 is made of quartz. The alignment member 6 aligns the sealing member 3. In the figure, the gas supply portion 41 and the gas supply pipe 5 are held by a pair of ring-shaped holding plates 30 and 31. The pair of ring-shaped holding plates 30 and 31 are tightened by a bolt 32 and a nut 37.

Figure 5:
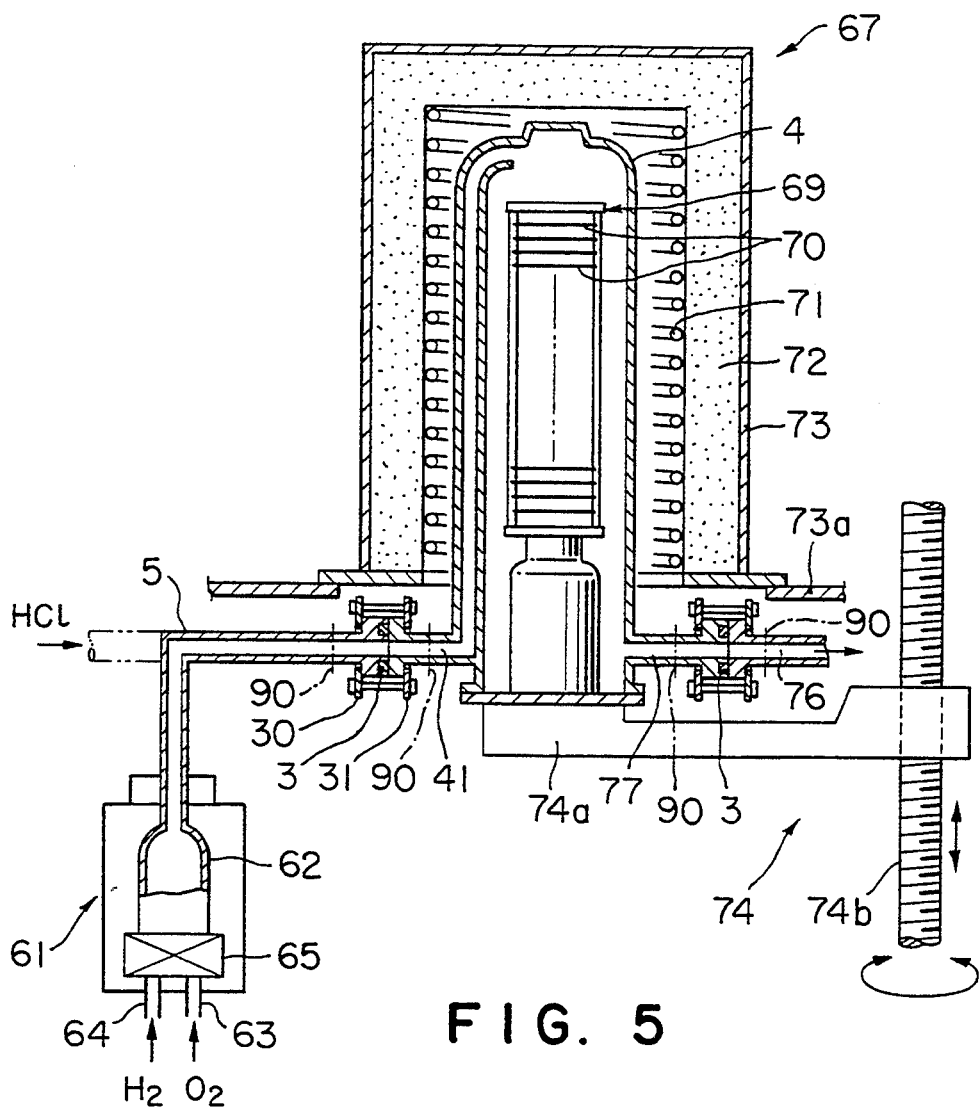
FIG. 5 is a sectional view for explaining the position of the heat-treating apparatus used in wet oxidizing equipment.

FIG. 5 is a sectional view schematically showing wet oxidizing equipment.

In the figure, reference numeral 61 depicts an external combustion apparatus. The external combustion apparatus 61 has a cylindrical combustion vessel 62. The combustion vessel 62 is made of a heat resisting material such as quartz glass. A center portion of the bottom of the combustion vessel 62 is connected to an oxygen supply pipe 63 and a hydrogen supply pipe 64. Literally, the oxygen supply pipe 63 supplies oxygen gas, whereas the hydrogen supply pipe 64 supplies hydrogen gas. The bottom of the combustion vessel 62 is covered with an electric heater 65. The electric heater 65 heats oxygen gas and hydrogen gas so that their temperatures exceed their ignition points. A center portion at the top of the combustion vessel 62 is connected to one end of a gas supply pipe 5 which is made of a heat resisting and corrosive resisting material (for example, quartz glass). The other end of the gas supply pipe 5 is connected to an upright type heat-treating apparatus 67.

The upright type heat-treating apparatus 67 has a cylindrical reaction vessel 4. The reaction vessel 4 is fixed and extends vertically within the heat-treating apparatus 67. The reaction vessel 4 is made of a heat resisting material such as quartz glass. The upper end of the reaction vessel 4 is closed, whereas the lower end thereof is open. A known wafer boat 69 is placed upwardly into the reaction vessel 4. The wafer boat 69 is made of for example quartz glass. A plurality of workpieces to be processed (for example, semiconductor wafers) are disposed vertically at predetermined pitches in the wafer boat 69. The wafer boat 69 is held by a base 74a of an elevator 74. As a feed thread 74b is rotated, the wafer boat 69 is upwardly fed into the reaction vessel 4. After the substances in the wafer boat 69 are processed, the wafer boat 69 is downwardly moved.

A heating means (for example, an electric heater 71) is coaxially disposed on the periphery of the reaction vessel 4. The electric heater 71 is held by an cylindrical outer shell 73 through a heat insulating member 72. The outer shell 73 is made of for example stainless steel. These parts constitute a heating furnace. The heating furnace is held on a fixed base 73a.

By controlling the voltage applied to the electric heater 71, the temperature in the workpiece accommodating region in the reaction vessel 4 can be set at a fixed value in the range from 500° to 1200° C.

A gas supply portion 41 made of quartz glass is integrally formed at a lower portion of the reaction vessel 4. The gas supply portion 41 and the gas supply pipe 5 are held by a pair of ring-shaped holding plates 30 and 31. The gas supply portion 4 and the gas supply pipe 5 are connected through the sealing member 3. An exhaust portion 77 made of quartz glass is integrally formed at a lower portion of the reaction vessel 4. The exhaust portion 77 is disposed on the opposite side to the gas supply portion 41. The exhaust portion 77 and the gas exhaust pipe 76 are held by the ring-shaped holding plates 30 and 31. The exhaust portion 77 and the gas exhaust pipe 76 are connected through the sealing member 3.

When HCl oxidizing process or wet oxidizing process is performed, oxygen ($O_2$) and hydrogen ($H_2$) are supplied to the external combustion equipment 61. Oxygen and hydrogen react in the external combustion equipment 61, thereby producing water vapor ($H_2O$). The water vapor is supplied to the reaction vessel 4 along with a HCl gas of HCl gas supply pipe through the gas supply pipe 5.

Next, semiconductor wafers 70 in the reaction vessel 4 are heated and wet-oxidized by the electric heater 71. A gas which passes through the vicinity of the semiconductor wafers 70 is exhausted to the outside from the exhaust portion 77 by an exhaust pump (not shown) at a pressure lower than the atmospheric pressure by around 10 mm $H_2O$.

For example, when the reaction vessel 4 is heated to a temperature of 1000° C., the sealing member 3 is heated to 200° C. by thermal conduction from the reaction vessel 4. With the heat of the reaction vessel 4, the sealing member 3 is heated to a temperature in the range from 100° to 250° C.

In FIG. 5, reference numeral 90 represents portions which are easily broken when the sealing member 3 is removed.

As described above, according to the heat-treating apparatus of the present invention, the sealing member 3 has high sealing characteristics for a long time without thermally adhering to the sealing surface in a high temperature and corrosive gas atmosphere.

The sealing member 3 can be used for various semiconductor producing apparatus in which it is exposed to a high temperature atmosphere of around 200° C. and a corrosive gas. According to the present invention, the types of heat-treatinges are not limited. Besides wet oxidizing process and HCl oxidizing process, the present invention may be applied to various processes such as dry oxidizing process, CVD process, etching process, LCD heat-treating, and TFT film forming process.

Second Embodiment

Next, with reference to FIG. 6, a second embodiment of the present invention will be described.

Figure 6:
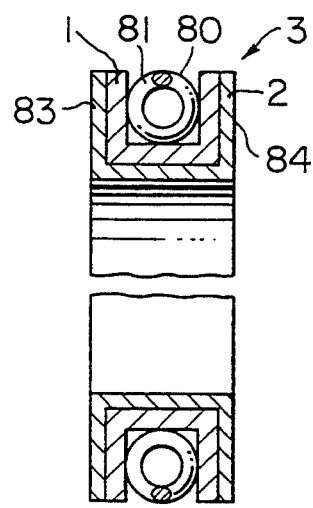
FIG. 6 is a sectional view of a sealing member of a heat-treating apparatus according to a second embodiment of the present invention.

FIG. 6 is a sectional view showing a sealing member 3 for use in a heat-treating apparatus according to the present invention. As shown in the figure, a core member 1 of the sealing member 3 has a bracket-shaped section where one side is open and the other side is closed. The open portion of the core member 1 faces outward in the radial direction. A coil spring 81 is disposed within space 80 formed by the bracket-shaped section of the core member 1.

The coil spring 81 is disposed along the periphery of the core member 1. The coil spring 81 widens the opening of the core member 1. The film 2 of the sealing member 3 covers portions other than the open portion of the surface of the core member 1.

To prevent the core member 1 from being exposed to a process gas, the portion which is not covered with the film 2 should be disposed in such a way that this portion faces outward in the radial direction. In FIG. 6, reference numerals 83 and 84 represent respective sealing surfaces.

As mentioned above, only the portion of the core member 1 which is exposed to a process gas may be covered with the film 2. In addition, the entire surface of the core member 1 may be covered with the film 2.

Third Embodiment

Next, with reference to FIG. 7, a third embodiment of the present invention will be described.

Figure 7:
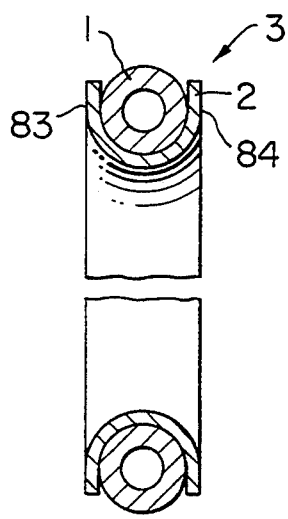
FIG. 7 is a sectional view of a sealing member of a heat-treating apparatus according to a third embodiment of the present invention.

FIG. 7 is a sectional view showing a sealing member for use in a heat-treating apparatus according to the present invention. In the figure, reference numeral 3 depicts the sealing member. A core member 1 of the sealing member 3 has a ring-shaped section. The film 2 has a semi-ring-shaped section so that the film 2 covers portions other than an outer radial portion (outer portion) of the core member 1.

As with the second embodiment, in the third embodiment, the sealing member 3 should be disposed in such a way that the portion which is not covered with the film 2 faces outward. In FIG. 7, reference numerals 83 and 84 represent respective sealing surfaces.

Fourth Embodiment

Next, with reference to FIGS. 9 to 12, a fourth embodiment of the present invention will be described.

FIGS. 9 to 12 are sectional views and a perspective view showing upright type CVD equipment to which a heat-treating apparatus according to the present invention is applied.

In the figure, reference numeral 101 is the upright type CVD equipment. In the upright type CVD equipment 101, a cylindrical process vessel 103 which is made of for example quartz is almost vertically disposed. An opening 102 is disposed at one end of the process vessel 103. The opening 102 faces downward. The process vessel 103 comprises an outer vessel 103a and an inner vessel 103b (namely, the process vessel 103 is of dual vessel type). Below the process vessel 103, a process gas supply pipe 104 and an inert gas supply pipe 105 are connected so that they extrude inside the inner vessel 103b. An exhaust pipe 106 is connected to an opening defined by the outer vessel 103s and the inner vessel 103b of the process vessel 103. Around the process vessel 103, a heater 107, a heat insulating member 108, and an outer shell 109 are disposed in the outer-to-inner order. The outer shell 109 is made of stainless steel or the like.

The process gas supply pipe 104 is connected to a process gas supply mechanism (not shown). The process gas supply pipe 104 supplies a predetermined CVD gas to the inner vessel 103b from a lower portion thereof. The exhaust pipe 106 is connected to a vacuum pump 110. In the middle of the exhaust pipe 106, a dust counter 111 and an auto pressure controller 112 are disposed. The dust counter 111 counts the number of dust particles contained in exhaust air which is circulated in the equipment. The auto pressure controller 112 automatically controls the pressure of a supply gas. The vacuum pump 110 exhausts a gas out of the equipment. With a predetermined CVD gas supplied by the process gas supply mechanism (not shown), the gas flows upward in the inner vessel 103b and then downward in the opening defined by the outer vessel 103a and the inner vessel 103b.

The inert gas supply pipe 105 is connected to an inert gas supply source 114 through a valve 113. By opening or closing the valve 113, an inert gas (for example, nitrogen gas) can be blown at a predetermined pressure. The valve 113 is opened and closed under the control of a control device 115 which is constituted of a microcomputer and so forth.

Below the process vessel 103, a boat elevator 116 which vertically moves is disposed. An elevator table 117 is disposed on the boat elevator 116. The elevator table 117 is provided with a cover 118 which tightly closes the opening 102. A rotating shaft 120 which passes through the cover 118 is connected to a drive motor 119. A magnetic fluid seal 121 is tightly disposed between the rotating shaft 120 and the cover 118. A turn table 122 is disposed at an upper end portion of the rotating shaft 120. A wafer boat 125 made of quartz is disposed on the turn table 122 through a constant temperature vessel 123. The wafer boat 125 accommodates a large number of semiconductor wafers in a shelf arrangement at predetermined pitches.

Next, in the upright type CVD equipment, film forming process of semiconductor wafers 124 will be described.

The interior of the process vessel 103 is preheated to a predetermined temperature by an electric heater 107 to which electricity is supplied from a power supply (not shown). The wafer boat 125 which accommodates the semiconductor wafers 124 is raised by the boat elevator 116. Thereafter, the wafer boat 125 is placed in the process vessel 103. When the elevator table 117 is raised to an uppermost position, the cover 118 tightly closes the opening 102.

As described above, by the vacuum pump 110 and the process gas supply mechanism (not shown), the CVD gas flows upward in the process vessel 103 and then downward along the opening defined by the outer vessel 103a and the inner vessel 103b. While the turn table 122 is being rotated, a predetermined CVD film is formed on each semiconductor wafer 124.

At this point, the CVD film is also formed on the inner walls of the outer vessel 103a and the inner vessel 103b of the process vessel 103, the surfaces of the wafer boat 124, and so forth. Part of the CVD film is peeled off from these portions and becomes dust particles. These dust particles float in the process vessel 103 and adhere to the semiconductor wafers 124. Thus, defects may take place in the resultant semiconductor wafers 124. As a result, the yield of resultant semiconductor wafers 124 lowers. The amount of dust particles increases in proportion to both the number of times the process is performed and the degree of contamination of the process vessel 103 (reacted product adheres to the semiconductor wafers 124).

To prevent that, in this embodiment, the dust counter 111 measures the number of dust particles which flow in the exhaust pipe 106 continuously or at predetermined intervals so as to monitor the degree of contamination in the process vessel 103. When the number of dust particles contained in the exhaust gas exceeds a predetermined level, the interior of the process vessel 103 is cleaned in the following manner. As shown in FIG. 10, the elevator table 117 disposed on the boat elevator 116 is lowered. The opening 102 is tightly closed by the cover 126. As an alternative manner, the wafer boat 125 is placed in the process vessel 103 while the semiconductor wafers 124 are not being placed on the wafer boat 125. The cover 126 is connected to the drive mechanism (not shown). Normally, the cover 126 is placed in such a manner that it does not interfere with the movement of the wafer boat 125. When the wafer boat 125 is removed, the cover 126 is moved to a lower portion of the opening 102 so that it is closed.

The cleaning process is performed in the following manner. The vacuum pump 110 continuously vacuum-ventilates a gas in the process vessel 103. When a pressure detector disposed in the auto pressure controller 112 detects a predetermined pressure, the valve 113 disposed on the inert gas supply pipe 105 is opened and thereby an inert gas (nitrogen gas in this embodiment) supplied from the inert gas supply source 114 is blown into the process vessel 103 for a predetermined period of time (for example, in the range from several seconds to several ten seconds). This process is continuously performed by the control device 115 (for example, several times to several ten times) until the number of dust particles contained in the exhaust gas measured by the dust counter 111 becomes less than the predetermined value.

When nitrogen gas is rapidly blown into the process vessel 103 which is almost vacuum, the blowing speed of the nitrogen gas is very high. Thus, a reacted product which weakly adheres to the inner walls of the process vessel 103 is peeled off and exhausted to the outside of the process vessel 103.

Thus, after the film forming process of the semiconductor wafers 124 is resumed, since a reacted product is not peeled off, occurrences of dust particles can be suppressed. Thus, the film forming process can be performed in low dust condition. As a result, unlike with the conventional film forming process, it is not necessary to remove the process vessel 103, wet clean it, and mount it again. Thus, in the present invention, the rate of operation of the equipment can be remarkably raised. Although the reacted product which strongly adheres to the inner walls of the process vessel 103 and so forth cannot be removed by such a cleaning process, it is almost never peeled off as dust particles. Thus, even if the film forming process of the semiconductor wafers 124 is performed with such a reacted product, the yield and so forth are not lowered.

In addition, according to this embodiment, since the dust counter 111 monitors the number of dust particles contained in the exhaust air (it is stated that the number of dust particles contained in the exhaust gas is equivalent to that contained in the process vessel 103), a timing at which the cleaning process should be performed can be adequately known. Thus, since the cleaning process can be adequately performed, occurrences of defective wafers and decrease of yield thereof can be prevented. In addition, a decrease of rate of operation of the equipment can be prevented.

FIG. 11 is a sectional view showing the construction of an upright type CVD equipment 101a according to another embodiment of the present invention. In this embodiment, a plurality of nozzles 130 are disposed on a cover 126. The number of nozzles 130 is for example four. The nozzles 130 supply inert gas to a process vessel 103. The cover 126 closes an opening 102 of the process vessel 103 while the film forming process is not being performed. As shown in the figure, the nozzles 130 are disposed in the same direction on the same circumference. With an inert gas blown from the nozzles 130, an eddy stream of inert gas can be formed in the process vessel 103. For the sake of simplicity, the portions according to the above-described embodiment are denoted by the similar reference numerals thereof and their description is omitted.

In the upright type CVD equipment 101a, by performing the cleaning of the interior of the process vessel 103 in the same manner as the above-described embodiment, the similar effects can be obtained. In addition, by actively forming an eddy stream of inert gas in the process vessel 103, the reacted product which weakly adheres to the inner walls of the process vessel 103 can be acceleratively peeled off. Thus, more effectively the cleaning process can be performed.

In the above described embodiments, the present invention was applied to the upright type CVD equipment. However, it should be noted that the present invention is not limited to these embodiments. Rather, the present invention may be applied to a flat type heat-treating apparatus, an etching apparatus, and the like.

As described above, according to the present invention, the cleaning of the interior of the process vessel can be effectively performed.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A heat-treating apparatus, comprising:
   a reaction vessel being adapted for performing a heat-treating for a workpiece to be treated and having a joint pipe portion;
   an outer pipe jointed to said joint pipe portion of said reaction vessel; and
   a sealing member disposed between said outer pipe and said joint pipe portion and adapted for tightly closing a passage defined inside said outer pipe and said joint pipe portion,
   wherein said sealing member having a relatively soft core member and a film disposed on the surface of said core member and harder than said core member, said film having heat resistance and a chemical resistance.

2. The heat-treating apparatus as set forth in claim 1, wherein said core member of said sealing member is hollow.

3. The heat-treating apparatus as set forth in claim 2, wherein said core member of said sealing member has a rectangular section, at least one of side portions of said core member abutting against said outer pipe and said joint pipe portion having a convex portion.

4. The heat-treating apparatus as set forth in claim 2, wherein said film of said sealing member covers the entire surface of said core member.

5. The heat-treating apparatus as set forth in claim 1, wherein said core member of said sealing member has a bracket-shaped section with one side open, said open side facing outward.

6. The heat-treating apparatus as set forth in claim 5, wherein said film of said sealing member covers portions other than said open side of said core member.

7. The heat-treating apparatus as set forth in claim 5, wherein said sealing member has a coil spring disposed in a space defined by said bracket-shaped section of said core member, said coil spring widening said open side.

8. The heat-treating apparatus as set forth in claim 1, wherein said core member of said sealing member has a ring-shaped section.

9. The heat-treating apparatus as set forth in claim 8, wherein said film of said sealing member covers portions other than the outer side of the surface of said core member.

10. The heat-treating apparatus as set forth in claim 1, wherein the HS hardness of said core member is approximately 32, and
wherein the compression permanent distortion ratio of said core member at a temperature of 100° C. is 65% or less.

11. The heat-treating apparatus as set forth in claim 10, wherein said core member is made of an ethylene tetrafluoride resin.

12. The heat-treating apparatus as set forth in claim 1, wherein said film has a heat resistance of 150° to 250° C.

13. The heat-treating apparatus as set forth in claim 12, wherein said film is made of an ethylene tetrafluoride rubber.

14. The heat-treating apparatus as set forth in claim 1, wherein said core member is made of an ethylene tetrafluoride resin, and
wherein said film is made of an ethylene tetrafluoride rubber.

15. The heat-treating apparatus as set forth in claim 1, wherein said outer pipe is connected to a pipe which supplies a corrosive gas.

16. The heat-treating apparatus as set forth in claim 1, wherein said sealing member is heated at a temperature of 100° to 250° C.

* * * * *